United States Patent
Lee (10) Patent No.: US 9,214,207 B2
(45) Date of Patent: Dec. 15, 2015

(54) APPARATUS AND METHOD FOR DATA DECODING

(71) Applicant: Samsung Electronics Co., Ltd., Suwon-si (KR)

(72) Inventor: Won Chang Lee, Seongnam-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 434 days.

(21) Appl. No.: 13/661,635

(22) Filed: Oct. 26, 2012

(65) Prior Publication Data

US 2013/0227211 A1 Aug. 29, 2013

(30) Foreign Application Priority Data

Feb. 27, 2012 (KR) ........................ 10-2012-0019524

(51) Int. Cl.
- *G06F 13/00* (2006.01)
- *G06F 13/28* (2006.01)
- *G11C 8/10* (2006.01)
- *G06F 13/16* (2006.01)

(52) U.S. Cl.
CPC . *G11C 8/10* (2013.01); *G06F 13/16* (2013.01)

(58) Field of Classification Search
CPC ................................. G06F 13/16; G06F 13/36
See application file for complete search history.

(56) References Cited

U.S. PATENT DOCUMENTS

| | | | |
|---|---|---|---|
| 6,785,795 | B1 | 8/2004 | De Perthuis et al. |
| 7,051,123 | B1 | 5/2006 | Baker et al. |
| 2002/0146023 | A1* | 10/2002 | Myers .......................... 370/412 |
| 2003/0122834 | A1* | 7/2003 | Mastronarde et al. ........ 345/535 |

FOREIGN PATENT DOCUMENTS

| | | |
|---|---|---|
| KR | 2001-0029924 | 4/2001 |
| KR | 10-2007-0115217 | 12/2007 |
| KR | 10-2010-0073026 | 7/2010 |

OTHER PUBLICATIONS

Joon-Ho Song; Doo Hyun Kim; Do-Hyung Kim; Shi Hwa Lee, "High-performance memory interface architecture for high-definition video coding application," Image Processing (ICIP), 2010 17th IEEE International Conference on , vol., No., pp. 3745,3748, Sep. 26-29, 2010.*

* cited by examiner

*Primary Examiner* — Eric S Cardwell (74) *Attorney, Agent, or Firm* — Staas & Halsey LLP (57) ABSTRACT

A data decoding apparatus is provided, which includes at least one processor block, at least one hardware block, and a memory processing unit to control the at least one processor block or the at least one hardware block to access a memory and to read or write data with minimum delay.

17 Claims, 6 Drawing Sheets

FIG. 6

APPARATUS AND METHOD FOR DATA DECODING

CROSS-REFERENCE TO RELATED APPLICATIONS

This application claims the priority benefit of Korean Patent Application No. 10-2012-0019524, filed on Feb. 27, 2012, in the Korean Intellectual Property Office, the disclosure of which is incorporated herein by reference.

BACKGROUND

1. Field

Embodiments relate to a data decoding apparatus and method for reducing a bandwidth.

2. Description of the Related Art

Generally, a processor block and a hardware block included in a decoding apparatus transmit or receive data with respect to an external memory during decoding.

When an amount of data between the processor block and a memory increases, a data transmission rate is reduced due to direct memory access (DMA) setting latency and access latency, thereby deteriorating system performance.

When at least two processor blocks and hardware blocks simultaneously request data transmission from the memory, data transmission may not be performed according to an optimum decoding order. Therefore, decoding may be impeded.

A general decoding apparatus, using pluralities of processor blocks and hardware blocks, may access the memory using a DMA controller provided in each processor block and each hardware block. Since the general decoding apparatus usually transmits data in a rectangular form, after transmission of data of one horizontal line, an overhead is generated until transmission of next line data, accordingly increasing the data transmission time.

When at least two processor blocks or hardware blocks request transmission from the memory in the general decoding apparatus, data transmission is performed only according to an order set by the DMA controller because communication between the decoding apparatus and the memory is not defined.

SUMMARY

According to an aspect of one or more embodiments, there is provided a data decoding apparatus which includes at least one processor block, at least one hardware block, and a memory processing unit that controls the at least one processor block or the at least one hardware block to access a memory and to read or write data with minimum delay.

According to an aspect of one or more embodiments, there is provided a data decoding apparatus including at least one processor block, at least one hardware block, and a memory processing unit to control the at least one processor block or the at least one hardware block to access a memory and to read or write data with minimum delay.

The memory processing unit may control the data to be written to a DRAM and read from a DRAM in parallel.

The memory processing unit may include an arbitration unit to select a block for writing the data from the at least one processor block or the at least one hardware block, a memory control unit to transmit data of the selected at least one processor block or data of the selected at least one hardware block to an internal buffer, and a tiling unit to tile the data of the selected at least one processor block or the data of the selected at least one hardware block such that a number of data pieces transmitted to the at least one processor block or the at least one hardware block is maximized. The memory control unit may store the tiled data in the memory.

The memory processing unit may include an arbitration unit to select a block for reading the data from the at least one processor block or the at least one hardware block, a memory control unit to store tiled data to be read by the selected processor block or hardware block, in an internal buffer or a cache, and an untiling unit to untile the tiled data such that a number of data pieces transmitted to the at least one processor block or the at least one hardware block is maximized. The memory control unit may transmit the untiled data to the selected processor block or hardware block.

The memory control unit may pad the untiled data and transmits the padded data to the selected processor block or hardware block.

The arbitration unit may select the block for reading or writing the data in consideration of a data transmission order of the at least one processor block and the at least one hardware block.

Each of the at least one processor block or each of the at least one hardware block may include a memory reading level register, and a memory writing level register.

The arbitration unit may increase a memory reading level register value of a block that receives a data reading command when the data reading command for the at least one processor block or the at least one hardware block is received.

The arbitration unit may select a block having a largest memory reading level register value, from the at least one processor block or the at least one hardware block.

The arbitration unit may increase a memory writing level register value of a block that receives a data writing command when the data writing command for the at least one processor block or the at least one hardware block is received.

The arbitration unit may select a block having a largest memory writing level register value, from the at least one processor block or the at least one hardware block.

According to an aspect of one or more embodiments, there is provided a data decoding method including maintaining at least one processor block, maintaining at least one hardware block, and controlling the at least one processor block or the at least one hardware block to access a memory and to read or write data with minimum delay, using a dedicated memory processing unit.

According to an aspect of one or more embodiments, there is provided a data decoding method including reading a memory writing level register value of each of the at least one processor block or each of the at least one hardware block, selecting a block having a largest memory writing level register value by comparing the memory writing level register value of each of the at least one processor block or each of the at least one hardware block, and writing the data of the selected block in a memory.

According to an aspect of one or more embodiments, there is provided a data decoding method including reading a memory reading level register value of each of the at least one processor block or each of the at least one hardware block, selecting a block having a largest memory reading level register value by comparing the memory reading level register value of each of the at least one processor block or each of the at least one hardware block, and reading the data from a memory and transmitting the read data to the selected block.

According to another aspect of one or more embodiments, there is provided at least one non-transitory computer readable medium storing computer readable instructions to implement methods of one or more embodiments.

BRIEF DESCRIPTION OF THE DRAWINGS

These and/or other aspects will become apparent and more readily appreciated from the following description of embodiments, taken in conjunction with the accompanying drawings of which.

DETAILED DESCRIPTION

Reference will now be made in detail to embodiments, examples of which are illustrated in the accompanying drawings, wherein like reference numerals refer to the like elements throughout.

In embodiments, if detailed descriptions of related disclosed art or configuration are determined to unnecessarily make the subject matter of embodiments obscure, they will be omitted. Terminology to be used below are defined based on their functions in the present invention and may vary according to users, user's intentions, or practices. Therefore, the definitions of the terms should be determined based on the entire specification.

Figure 1:
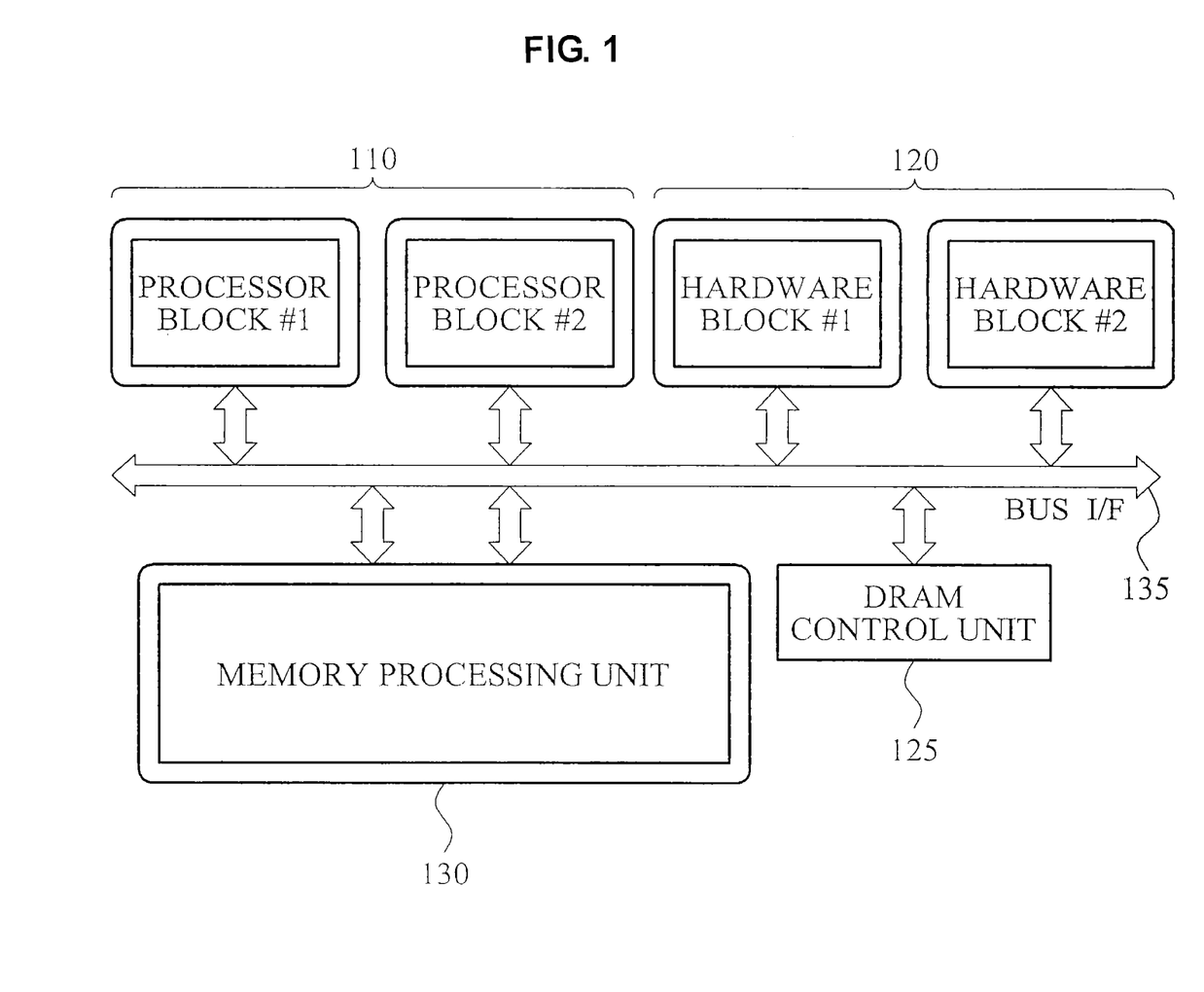
FIG. 1 illustrates a data decoding apparatus according to embodiments.

FIG. 1 illustrates a data decoding apparatus according to embodiments.

Referring to FIG. 1, the data decoding apparatus includes at least one processor block 110, at least one hardware block 120, and a memory processing unit (memory processor) 130 to control the at least one processor block 110 or the at least one hardware block 120 to access a memory and to read or write data with minimum delay. FIG. 1 also shows a dynamic random access memory (DRAM) control unit (DRAM controller) 125 which may communicate with at least one processor block 110, at least one hardware block 120, and the memory processing unit 130 through a bus interface (I/F) 135. I/F denotes interface.

In the data decoding apparatus according to embodiments, access to a memory is performed entirely through the memory processing unit 130 rather than at least one processor block 110 or the at least one hardware block 120 accessing the memory directly.

The data decoding apparatus may transmit data of the memory with minimum delay through the memory processing unit 130, and monitor a current data transmission state of the at least one processor block 110 and the at least one hardware block 120. Therefore, the data of the memory may be transmitted in an optimum order.

Figure 2:
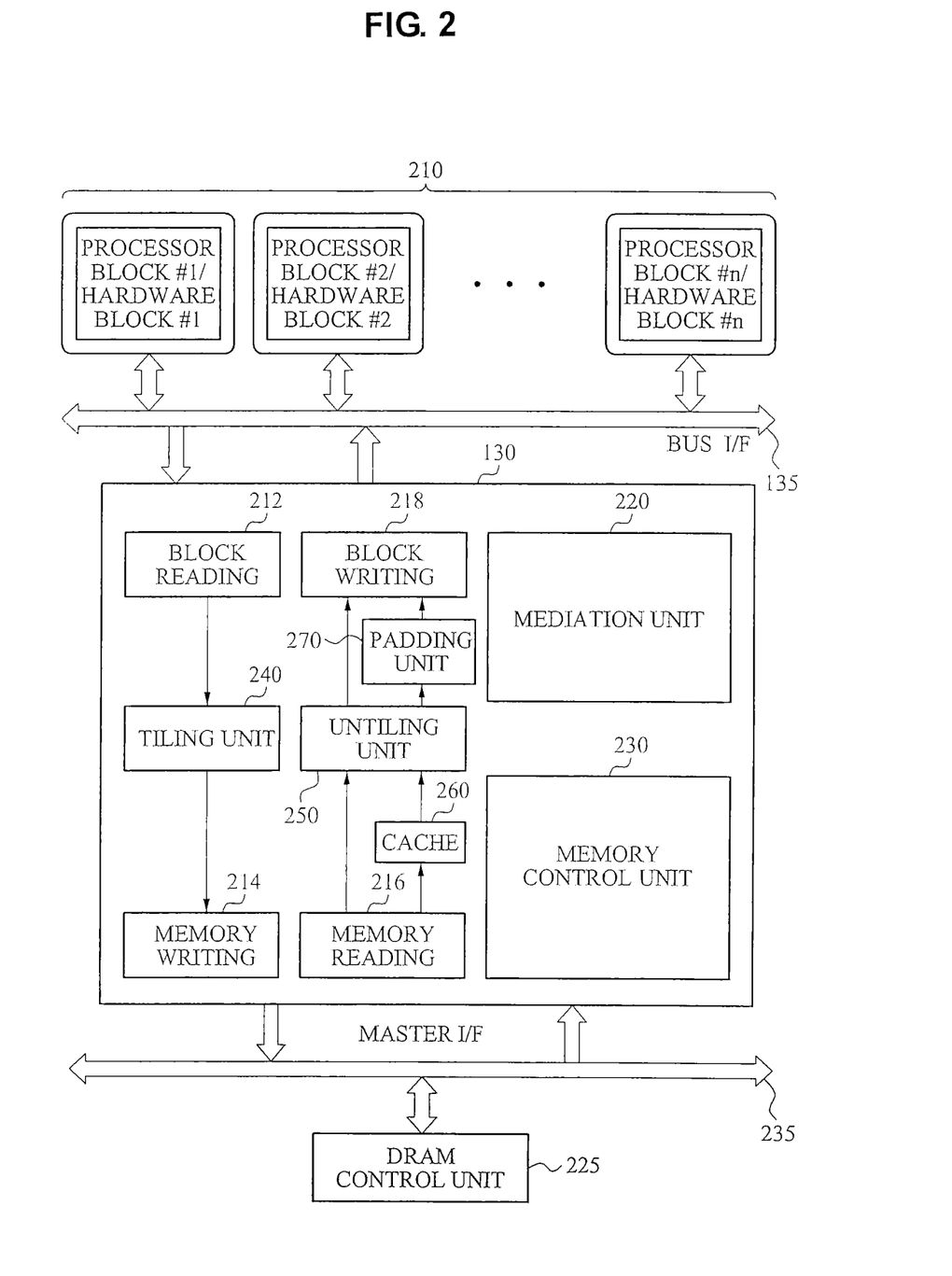
FIG. 2 illustrates a structure of a memory processing unit in detail, according to embodiments.

FIG. 2 illustrates a detailed structure of a memory processing unit 130 according to embodiments.

Referring to FIG. 2, the memory processing unit (memory processor) 130 may control data to be written to a DRAM and read from a DRAM in parallel.

Hereinafter, a process of reading the data from the at least one processor block or the at least one hardware block 210 and writing the data to the memory using the memory processing unit 130 will be described.

The memory processing unit 130 may select a block for writing the data from at least one processor block and at least one hardware block 210 using an arbitration unit (mediation unit, mediator, or arbitrator) 220.

When writing data in the memory, the memory processing unit 130 may transmit data of the block selected by the arbitration unit 220 (block reading 212) to an internal buffer.

The memory processing unit 130 may transmit data of the selected processor block or hardware block to the internal buffer using a memory control unit (memory controller) 230.

The memory processing unit 130 may tile the data of the selected processor block or hardware block 210, such that a number of data pieces transmitted to the at least one processor block or the at least one hardware block 210 is maximized.

The memory processing unit 130 may link data through a tiling unit (tilor) 240 so as to maximize the number of data pieces to be transmitted at one time.

The memory processing unit 130 may store the tiled data in the memory (memory writing 214) using the memory control unit 230.

Hereinafter, a process of reading data from the memory and writing data in the at least one processor block or the at least one hardware block 210 using the memory processing unit 130 will be described.

The memory processing unit 130 may select a block for reading the data from the at least one processor block or the at least one hardware block 210 using the arbitration unit 220.

The memory processing unit 130 may store tiled data to be read by the selected processor block or hardware block in an internal buffer or a cache 260, using the memory control unit 230.

For example, when reading the memory (memory reading 216), the memory processing unit 130 may read data of the memory, the data needed by the processor block or hardware block selected by the arbitration unit 220, and store the read data in the internal buffer or the cache. Here, the data of the memory may be tiled and stored.

The memory processing unit 130 may untile the tiled data using an untiling unit (untilor) 250, such that a number of data pieces to be transmitted to the at least one processor block or the at least one hardware block 210 is maximized.

The memory processing unit 130 may transmit the untiled data to the selected processor block or hardware block 210, using the memory control unit 230.

The memory processing unit 130 may pad the untiled data using padding unit (paddor) 270 and transmit the padded data to the selected processor block or hardware block 210, using the memory control unit 230.

That is, the tiled data may be converted to the original form through the untiling function. The padding function may be added as necessary so that the data may be transmitted to the at least one processor block or the at least one hardware block 210.

Referring to FIG. 2, a dynamic random access memory (DRAM) control unit (DRAM controller) 225 may communicate with memory processing unit 130 by way of Master I/F 235. The memory processing unit 130 may communicate with the at least one processor block or the at least one hardware block 210 by way of bus I/F 135. I/F denotes interface.

Figure 3:
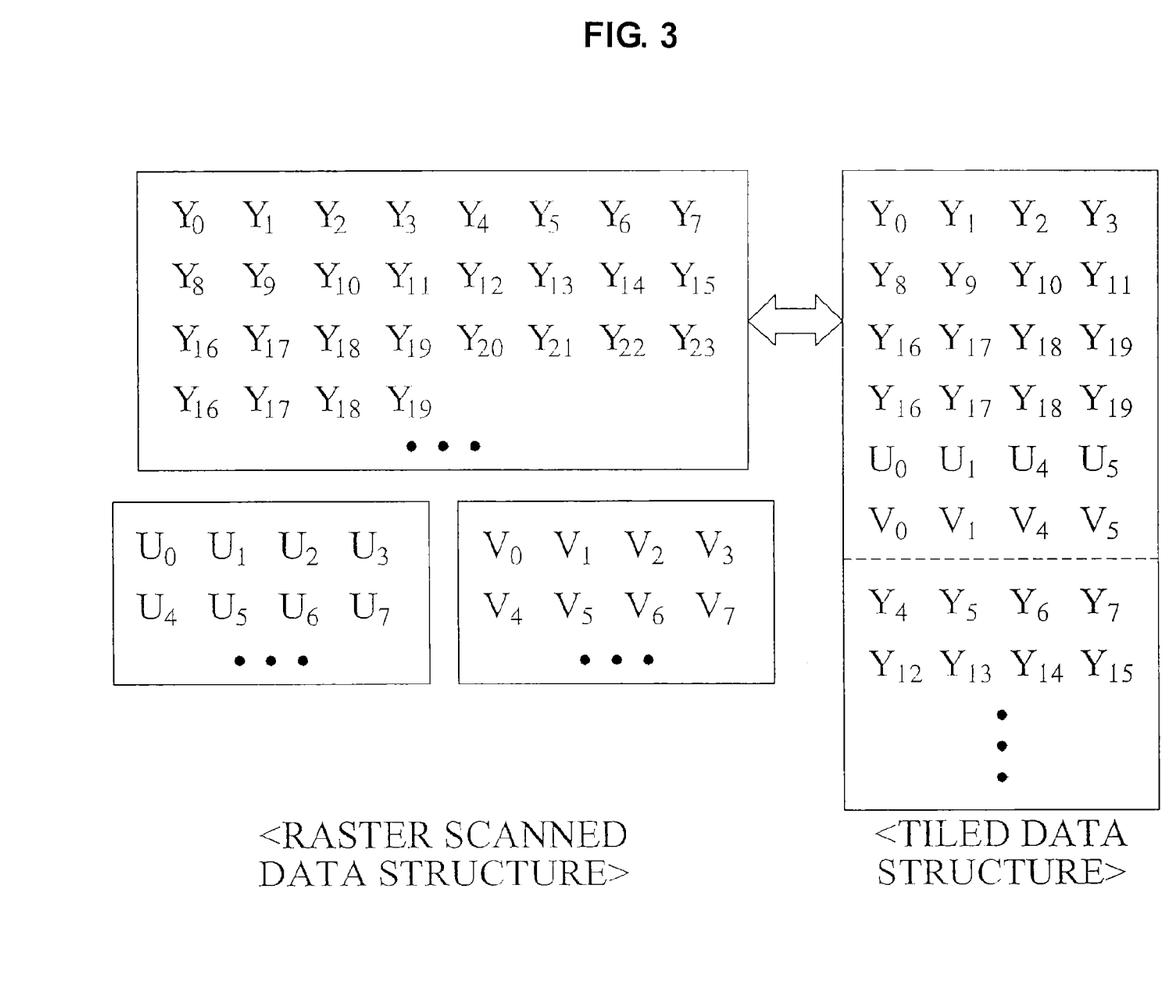
FIG. 3 illustrates an example of data conversion by tiling or untiling, according to embodiments.

FIG. 3 illustrates an example of data conversion by tiling or untiling, according to embodiments.

Referring to FIG. 3, a data decoding apparatus according to embodiments may link separate data Y, U, and V, thereby generating tiled data or untiled data.

Figure 4:
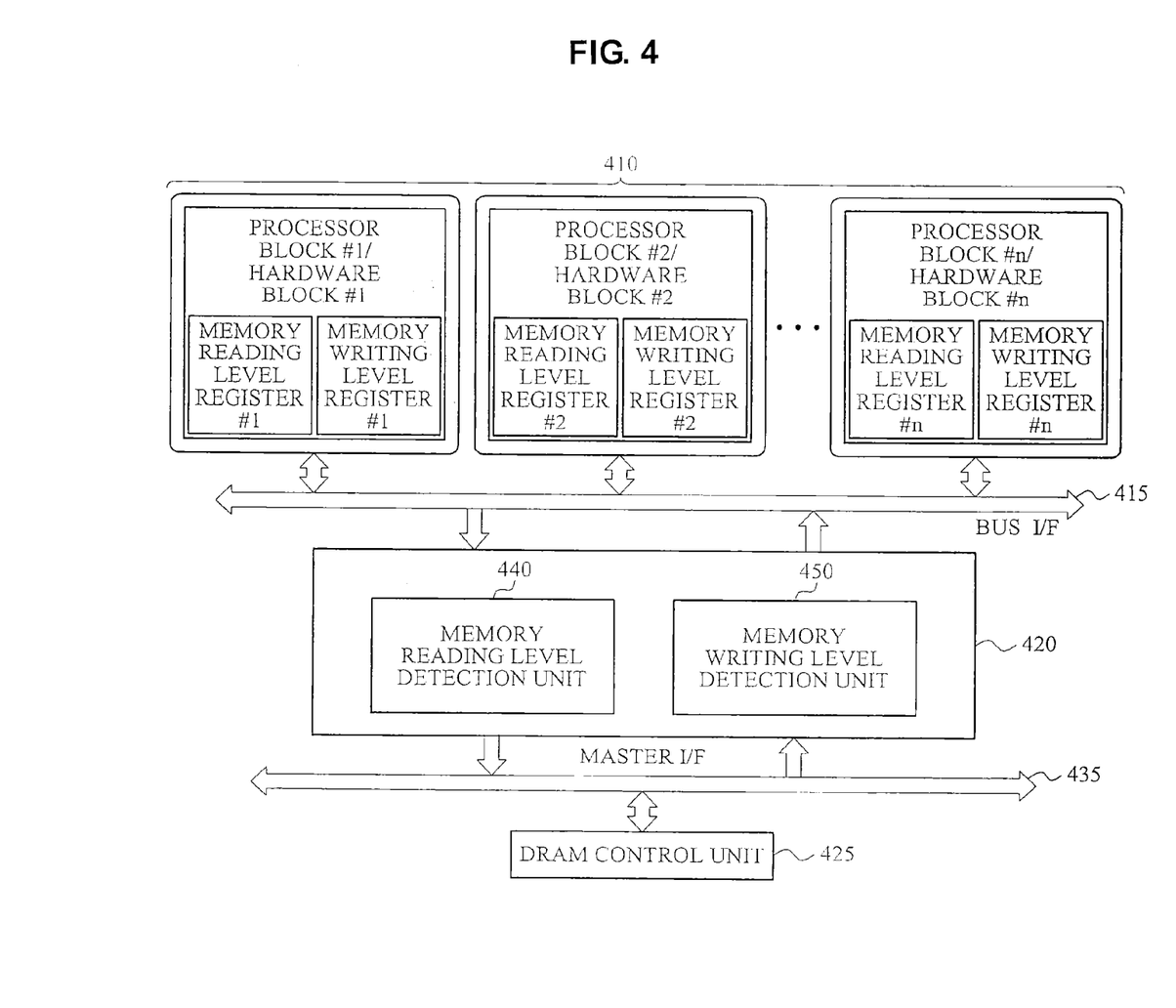
FIG. 4 illustrates an arbitration unit according to embodiments.

FIG. 4 illustrates an arbitration unit (arbitrator) 420 of a memory processing unit 130 which may communicate with the at least one processor block and the at least one hardware block 410 according to embodiments.

Referring to FIG. 4, the arbitration unit 420 may select a block for reading or writing data from at least one processor block and the at least one hardware block 410 in consideration of a data transmission order.

Each of the at least one processor block and each of the at least one hardware block 410 may include a memory reading level register and a memory writing level register.

The arbitration unit 420 may include a memory reading level detection unit 440. When a data reading command for the at least one processor block or the at least one hardware block 410 is received, the memory reading level detection unit 440 may increase a memory reading level register value of a block that receives the data reading command.

The arbitration unit 420 may select a block having a largest memory reading level register value from the at least one processor block and the at least one hardware block 410.

The arbitration unit 420 may include a memory writing level detection unit 450. When a data writing command for the at least one memory processing unit or the at least one hardware block 410 is received, the memory writing level detection unit 450 may increase a memory writing level register value of a block that receives the data writing command.

The arbitration unit 420 may select a block having a largest memory writing level register value from the at least one processor block and the at least one hardware block 410.

For example, when data of one block of a particular hardware block 410 is to be written in the memory, the arbitration unit 420 may increase the memory writing level register value by 1.

When a block to be transmitted is additionally generated, the arbitration unit 420 may continuously increase the memory writing level register value. When transmission of one block is completed by the memory processing unit 130, the arbitration unit 420 may decrease the memory writing level register value by 1.

According to an embodiment, data of a particular processor block or hardware block 410 is not accumulated without being transmitted, so that the overall performance of the data decoding apparatus is improved. Therefore, the memory processing unit 130 may monitor the memory writing level register or the memory reading level register of the all processor block and hardware block 410, and give a priority to a block maintaining the largest value.

Referring to FIG. 4, a dynamic random access memory (DRAM) control unit (DRAM controller) 425 may communicate with arbitration unit 420 of memory processing unit 130 by way of Master I/F 435. The memory processing unit 130 may communicate with the at least one processor block or the at least one hardware block 410 by way of bus I/F 415. I/F denotes interface.

Figure 5:
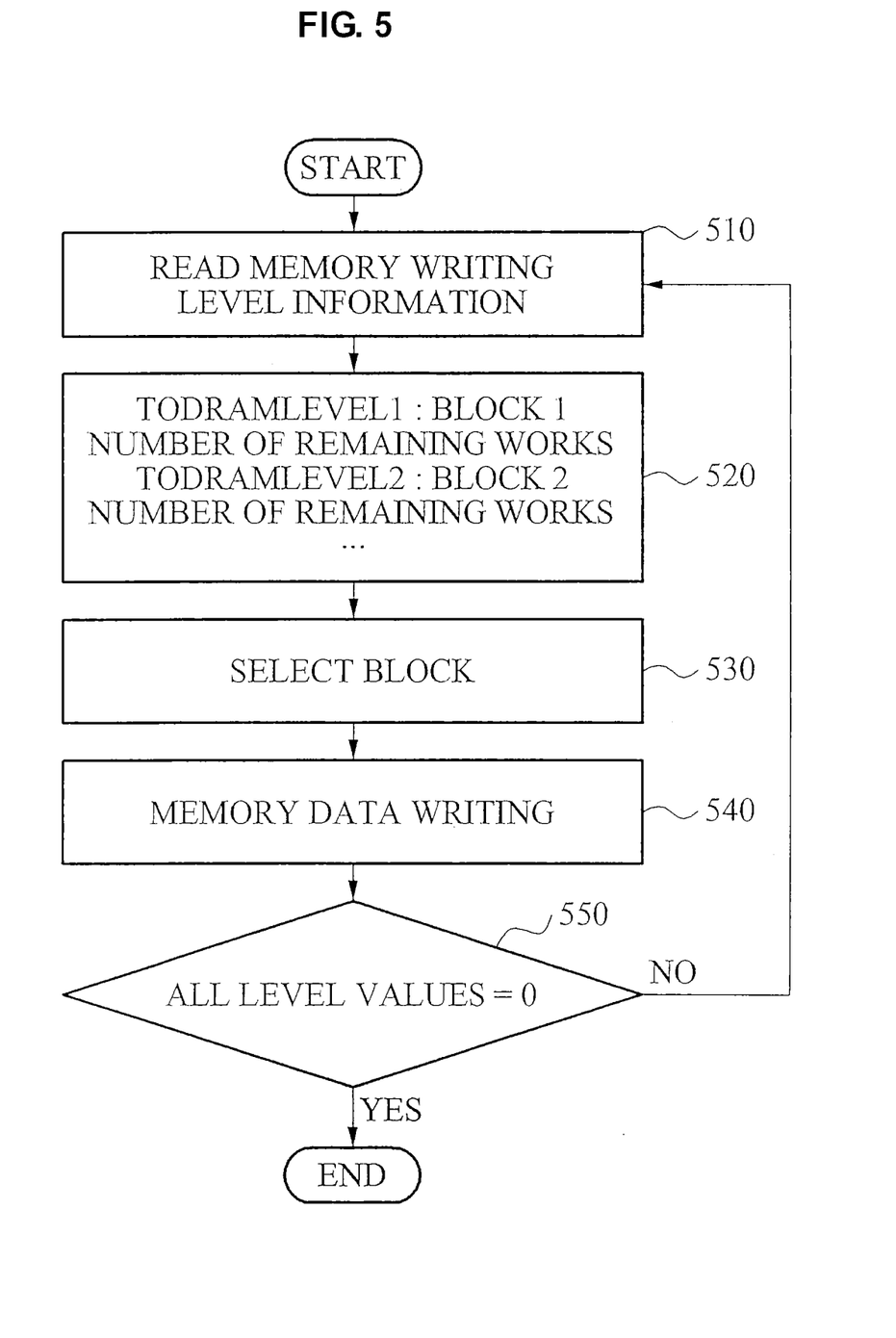
FIG. 5 illustrates a memory reading method of an arbitration unit according to embodiments.

Hereinafter, a memory writing method of an arbitration unit 420 will be described.

FIG. 5 illustrates a memory reading method of an arbitration unit 420 according to embodiments.

Referring to FIG. 5, the arbitration unit 420 may read a memory writing level register value of each of the at least one processor block or each of the at least one hardware block 410 in operation 510.

In operation 520, the arbitration unit 420 may monitor all the memory writing level register values.

In operation 530, the arbitration unit 420 may select a block having a largest memory writing level register value, by comparing all the memory writing level register values.

In operation 540, the arbitration unit 420 may write data of the selected block in a memory.

In operation 550, the arbitration unit 420 may compare the respective memory writing level register values and, when the memory writing level register values are all non-zero, repeat the aforementioned operations.

Figure 6:
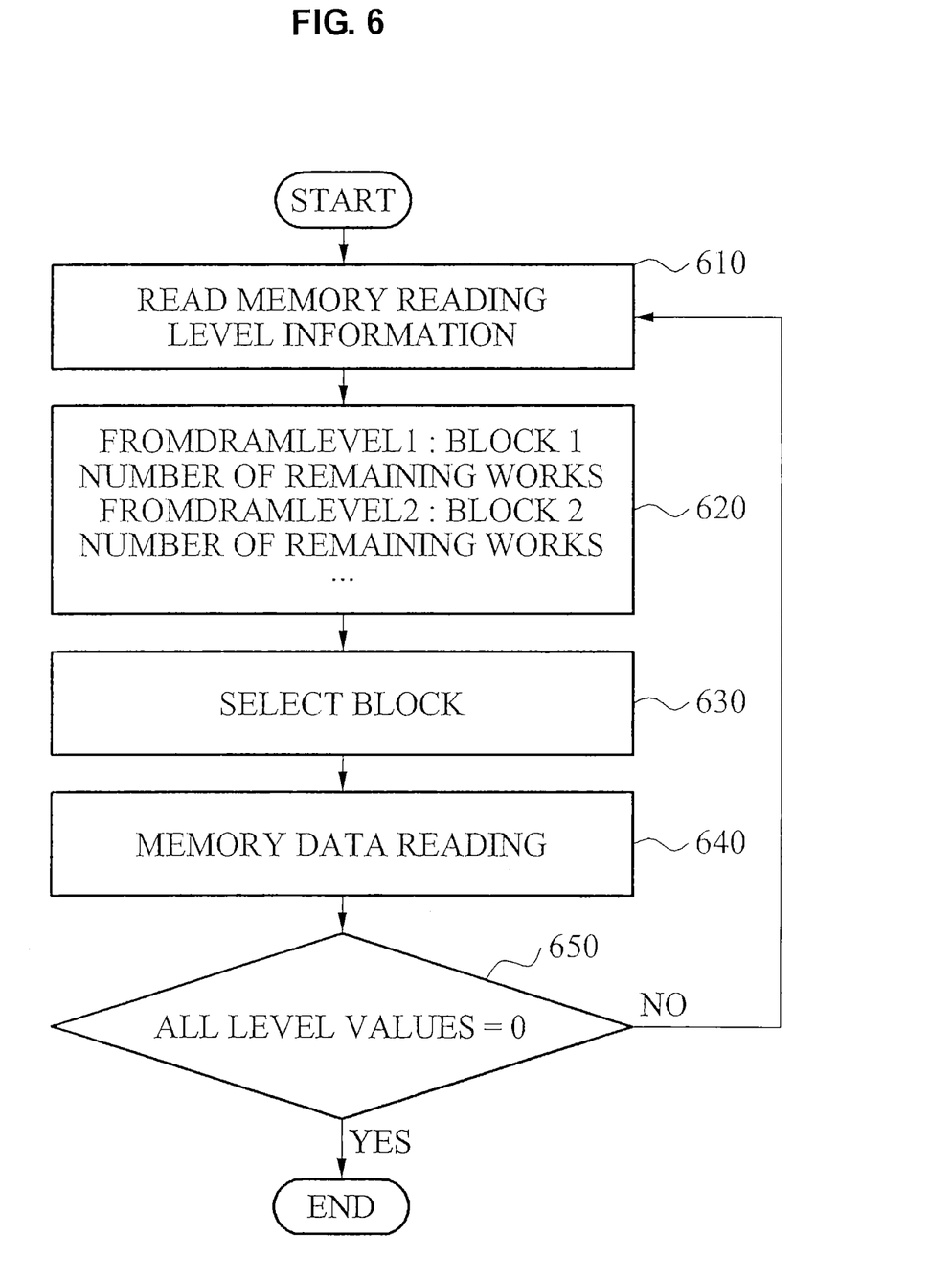
FIG. 6 illustrates a memory writing method of an arbitration unit according to embodiments.

Hereinafter, a memory reading method of an arbitration unit will be described.

FIG. 6 illustrates a memory writing method of an arbitration unit 420 according to embodiments.

Referring to FIG. 6, the arbitration unit 420 may read a memory reading level register value of each of the at least one processor block or each of the at least one hardware block 410, in operation 610.

In operation 620, the arbitration unit 420 may monitor all the memory reading level register values.

In operation 630, the arbitration unit 420 may select a block having a largest memory reading level register value, by comparing all the memory reading level register values.

In operation 640, the arbitration unit 420 may read data from the memory and transmit the read data to the selected block.

In operation 650, the arbitration unit 420 may compare the respective memory reading level register values and, when the memory reading level register values are all not zero, repeat the aforementioned operations.

A memory processing unit 130 may reduce a memory bandwidth by reducing an unnecessary overhead during data transmission, and may set an optimum order among at least one processor block and at least one hardware block. Accordingly, decoding efficiency may be increased.

For example, when the memory processing unit 130 according to embodiments is applied to a multi codec system including H.264/AVC, decoding time may be reduced in an environment in which a difference between a system bus and the at least one processor block and hardware block is great. AVC denotes advanced video decoding.

According to embodiments, the memory bandwidth may be minimized during memory transmission.

Additionally, overall performance of the data decoding apparatus may be improved by first transmitting data to a processor block or hardware block that most urgently needs the data.

Processes, functions, methods, and/or software in apparatuses described herein may be recorded, stored, or fixed in one or more non-transitory computer-readable storage media (computer readable recording medium) that includes program instructions (computer readable instructions) to be implemented by a computer to cause one or more processors to execute or perform the program instructions. The media may also include, alone or in combination with the program instructions, data files, data structures, and the like. The program instructions recorded on the media may be those specially designed and constructed for the purposes of embodiments, or they may be of the kind well-known and available to those having skill in the computer software arts. Examples of non-transitory computer-readable media include magnetic media such as hard disks, floppy disks, and magnetic tape; optical media such as CD ROM discs and DVDs; magneto-optical media such as optical discs; and hardware devices that are specially configured to store and perform program instructions, such as read-only memory (ROM), random access memory (RAM), flash memory, and the like. Examples of program instructions include both machine code, such as produced by a compiler, and files including higher level code that may be executed by the computer using an interpreter. The described hardware devices may be configured to act as one or more software modules that are recorded, stored, or fixed in one or more computer-readable storage media, in order to perform the operations and methods described above, or vice versa. In addition, a non-transitory computer-readable storage medium may be distributed among computer systems connected through a network and computer-readable codes or program instructions may be stored and executed in a decentralized manner. In addition, the computer-readable storage media may also be embodied in at least one application specific integrated circuit (ASIC) or Field Programmable Gate Array (FPGA).

Although embodiments have been shown and described, it would be appreciated by those skilled in the art that changes may be made in these embodiments without departing from the principles and spirit of the disclosure, the scope of which is defined in the claims and their equivalents.

What is claimed is:

1. A data decoding apparatus comprising:
    at least one processor block;
    at least one hardware block; and
    a memory processor to control the at least one processor block or the at least one hardware block to access a memory to read from the memory and to write data to the memory,
    wherein the memory processor monitors a current data transmission state of the at least one processor block and the at least one hardware block, and
    wherein the memory processor comprises:
    an arbitrator to select a block for reading the data from the at least one processor block or the at least one hardware block based upon the current data transmission state of the at least one processor block and the at least one hardware block and to select a block for writing the data from the at least one processor block or the at least one hardware block based upon the current data transmission state of the at least one processor block and the at least one hardware block, and to set an optimum order of decoding efficiency among the at least one processor block and the at least one hardware block based upon the current data transmission state of the at least one processor block and the at least one hardware block;
    a memory controller to transmit data of the selected at least one processor block or data of the selected at least one hardware block to an internal buffer and to store tiled data to be read by the selected processor block or hardware block, in an internal buffer or a cache;
    a tilor to tile the data of the selected at least one processor block or the data of the selected at least one hardware block such that a number of data pieces transmitted from the at least one processor block or the at least one hardware block to the memory is maximized; and
    an untilor to untile the tiled data such that a number of data pieces transmitted to the at least one processor block or the at least one hardware block is maximized, and
    wherein the memory controller stores the tiled data in the memory and transmits the untiled data to the selected processor block or hardware block.

2. The data decoding apparatus of claim 1, wherein the memory processor controls the data to be written to and read from the memory in parallel.

3. The data decoding apparatus of claim 1, wherein the memory controller pads the untiled data and transmits the padded data to the selected processor block or hardware block.

4. The data decoding apparatus of claim 1, wherein the arbitrator selects the block for reading or writing the data in consideration of a data transmission order of the at least one processor block and the at least one hardware block.

5. The data decoding apparatus of claim 1, wherein the arbitrator selects the block for reading or writing the data in consideration of a data transmission order of the at least one processor block and the at least one hardware block.

6. The data decoding apparatus of claim 1, wherein each of the at least one processor block or each of the at least one hardware block comprises:
    a memory reading level register; and
    a memory writing level register.

7. The data decoding apparatus of claim 6, wherein the arbitrator increases a memory reading level register value of a block that receives a data reading command when the data reading command for the at least one processor block or the at least one hardware block is received.

8. The data decoding apparatus of claim 7, wherein the arbitrator increases a memory writing level register value of a block that receives a data writing command when the data writing command for the at least one processor block or the at least one hardware block is received.

9. The data decoding apparatus of claim 8, wherein the arbitrator selects a block having a largest memory writing level register value, from the at least one processor block or the at least one hardware block.

10. The data decoding apparatus of claim 9, wherein the arbitrator increases a memory reading level register value of a block that receives a data reading command when the data reading command for the at least one processor block or the at least one hardware block is received.

11. The data decoding apparatus of claim 10, wherein the arbitrator selects a block having a largest memory reading level register value, from the at least one processor block or the at least one hardware block.

12. A data decoding method comprising:
    maintaining at least one processor block;
    maintaining at least one hardware block;
    controlling the at least one processor block or the at least one hardware block to access a memory and to read or write data, using a memory processor including an arbitrator;
    monitoring a current data transmission state of the at least one processor block and the at least one hardware block using the memory processor;
    selecting a block for writing the data from the at least one processor block or the at least one hardware block to the memory based upon the current data transmission state of the at least one processor block and the at least one hardware block using the arbitrator and selecting a block for reading the data from the at least one processor block or the at least one hardware block based upon the current data transmission state of the at least one processor block and the at least one hardware block using the arbitrator;
    setting an optimum order of decoding efficiency among the at least one processor block and the at least one hardware block based upon the current data transmission state of the at least one processor block and the at least one hardware block;
    transmitting data of the selected at least one processor block or data of the selected at least one hardware block to an internal buffer;
    tiling the data of the selected at least one processor block or the data of the selected at least one hardware block such that a number of data pieces transmitted from the at least one processor block or the at least one hardware block to the memory is maximized, and storing the tiled data in the memory;

storing tiled data to be read by the selected processor block or hardware block, in an internal buffer or a cache; and untiling the tiled data such that a number of data pieces transmitted to the at least one processor block or the at least one hardware block is maximized, and transmitting the untiled data to the selected processor block or hardware block, by a memory controller.

13. At least one non-transitory computer readable recording medium storing computer readable instructions to control at least one processor to implement the method of claim 12.

14. A data decoding method comprising:

reading a memory writing level register value of each of the at least one processor block or each of the at least one hardware block;

selecting a block having a largest memory writing level register value by comparing the memory writing level register value of each of the at least one processor block or each of the at least one hardware block based upon a current data transmission state of each of the at least one processor block and each of the at least one hardware block using an arbitrator;

setting an optimum order of decoding efficiency among the at least one processor block and the at least one hardware block based upon the current data transmission state of the at least one processor block and the at least one hardware block; and writing the data of the selected block in a memory, wherein aforementioned operations are repeated when the memory writing level register values are all not zero.

15. At least one non-transitory computer readable recording medium storing computer readable instructions to control at least one processor to implement the method of claim 14.

16. A data decoding method comprising:

reading a memory reading level register value of each of the at least one processor block or each of the at least one hardware block;

selecting a block having a largest memory reading level register value by comparing the memory reading level register value of each of the at least one processor block or each of the at least one hardware block based upon a current data transmission state of each of the at least one processor block and each of the at least one hardware block using an arbitrator;

setting an optimum order of decoding efficiency among the at least one processor block and the at least one hardware block based upon the current data transmission state of the at least one processor block and the at least one hardware block; and reading the data from a memory and transmitting the read data to the selected block, wherein aforementioned operations are repeated when the memory reading level register values are all not zero.

17. At least one non-transitory computer readable recording medium storing computer readable instructions to control at least one processor to implement the method of claim 16.

* * * * *